(12) United States Patent
Beppu

(10) Patent No.: US 11,309,841 B2
(45) Date of Patent: Apr. 19, 2022

(54) AMPLIFIER, METHOD OF MANUFACTURING AMPLIFIER, AND METHOD OF CORRECTING BIAS CURRENT

(71) Applicant: Murata Manufacturing Co., Ltd., Kyoto (JP)

(72) Inventor: Nobuyasu Beppu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 49 days.

(21) Appl. No.: 16/887,772

(22) Filed: May 29, 2020

(65) Prior Publication Data

US 2020/0295709 A1 Sep. 17, 2020

Related U.S. Application Data

(63) Continuation of application No. PCT/JP2018/043109, filed on Nov. 22, 2018.

(30) Foreign Application Priority Data

Dec. 1, 2017 (JP) .............................. JP2017-232064

(51) Int. Cl.
*H03F 1/02* (2006.01)
*H03F 3/19* (2006.01)

(52) U.S. Cl.
CPC ............. *H03F 1/0205* (2013.01); *H03F 3/19* (2013.01); *H03F 2200/451* (2013.01)

(58) Field of Classification Search
CPC ..... H03F 1/0205; H03F 3/19; H03F 2200/451
USPC ........................................................ 330/296
See application file for complete search history.

(56) References Cited

U.S. PATENT DOCUMENTS

| | | | |
|---|---|---|---|
| 6,731,916 B1 | 5/2004 | Haruyama | |
| 2001/0011926 A1 | 8/2001 | Adar | |
| 2002/0160734 A1 | 10/2002 | Li et al. | |
| 2004/0196102 A1 | 10/2004 | Eriksson | |

(Continued)

FOREIGN PATENT DOCUMENTS

| | | |
|---|---|---|
| GB | 2301248 A | 11/1996 |
| JP | H1065466 A | 3/1998 |
| JP | 2001094349 A | 4/2001 |

(Continued)

OTHER PUBLICATIONS

International Search Report issued in Application No. PCT/JP2018/043109, dated Feb. 19, 2019.

(Continued)

*Primary Examiner* — Hafizur Rahman
(74) *Attorney, Agent, or Firm* — Pearne & Gordon LLP

(57) ABSTRACT

An amplifier includes at least one amplification circuit through one of which a bias current flows, a first memory that stores control information to specify the bias current to be fed through the one of the at least one amplification circuit, a digital control circuit that generates a bias current setting to set the bias current in accordance with the control information, a second memory that stores correction information to correct the bias current setting, a correction circuit that corrects the bias current setting in accordance with the correction information, and a bias circuit that determines the bias current in the one of the at least one amplification circuit in accordance with the bias current setting, which has been corrected.

9 Claims, 10 Drawing Sheets

(56) References Cited

U.S. PATENT DOCUMENTS

2009/0023402 A1    1/2009    Shimizu et al.

FOREIGN PATENT DOCUMENTS

| JP | 2006333445 A | 12/2006 |
| JP | 2011259451 A | 12/2011 |
| JP | 2014017624 A | 1/2014 |

OTHER PUBLICATIONS

Written Opinion issued in Application PCT/JP2018/043109, dated Feb. 19, 2019.

AMPLIFIER, METHOD OF MANUFACTURING AMPLIFIER, AND METHOD OF CORRECTING BIAS CURRENT

This is a continuation of International Application No. PCT/JP2018/043109 filed on Nov. 22, 2018 which claims priority from Japanese Patent Application No. 2017-232064 filed on Dec. 1, 2017. The contents of these applications are incorporated herein by reference in their entireties.

BACKGROUND

Technical Field

The present disclosure relates to an amplifier including a bias circuit and an amplification circuit, a method of manufacturing the amplifier, and a method of correcting a bias current.

An amplifier including a bias circuit and an amplification circuit is installed in a communication apparatus, such as a mobile terminal. An example of an amplifier of this type is disclosed in Patent Document 1. This amplifier includes an analog amplification circuit, a digital signal processing circuit, and a controller that controls the gain of the analog amplification circuit. In this amplifier, the gain of the analog amplification circuit is controlled by measuring a signal that is output from the analog amplification circuit.

Patent Document 1: Japanese Unexamined Patent Application Publication No. 2011-259451

BRIEF SUMMARY

Variation in current consumption of an amplification circuit of an amplifier needs to be reduced as power consumption of a communication apparatus needs to be uniform. The variation in current consumption of an amplification circuit is generated, for example, by manufacturing variation of semiconductor elements included in an amplifier. Although the amplifier disclosed in Patent Document 1 is capable of controlling the gain of the amplification circuit, it is difficult to reduce the variation in current consumption of the amplification circuit of the amplifier, the variation being generated by a cause, such as manufacturing variation.

The present disclosure reduces the variation in current consumption of an amplification circuit of an amplifier.

An amplifier according to an aspect of the present disclosure includes an amplification circuit through which a bias current flows, a first memory that is configured to store control information specifying the bias current, a digital control circuit that is configured to generate a bias current setting to set the bias current in accordance with the control information, a second memory that is configured to store correction information to correct the bias current setting, a correction circuit that is configured to correct the bias current setting in accordance with the correction information, and a bias circuit that determines the bias current in the amplification circuit in accordance with the bias current setting, which has been corrected. The correction circuit corrects the bias current setting in accordance with the correction information obtained by measuring an actual bias current that flows through the amplification circuit in response to an input of the bias current setting into the bias circuit, the bias current setting being based on the control information.

In this way, the bias current setting is corrected in accordance with the correction information obtained by measuring the actual bias current in the at least one amplification circuit, and thus the variation in the bias current in the at least one amplification circuit can be reduced. The variation in current consumption of the at least one amplification circuit of the amplifier can be reduced by this procedure.

The bias circuit may be configured to output one of the at least one a voltage to determine the bias current in the amplification circuit.

In this way, the bias circuit outputs a voltage to determine the bias current in accordance with the bias current setting, which has been corrected, and thus the variation in the bias current flowing through the at least one amplification circuit can be reduced. The variation in current consumption of the at least one amplification circuit of the amplifier can be reduced by this procedure.

The correction circuit may include a multiplier and an adder that are configured to correct the bias current setting in accordance with the correction information.

In this way, the bias current setting can be corrected, and the variation in current consumption of the at least one amplification circuit of the amplifier can be reduced by using simple computing units, such as a multiplier and an adder-subtracter.

The multiplier may be configured to correct the bias current setting in accordance with the correction information obtained from a slope of the bias current as a function of the bias current setting, and the adder may be configured to correct the bias current setting in accordance with the correction information obtained from an y-intercept of the bias current function.

In this way, the bias current can be brought close to a reference value by correcting the bias current setting in accordance with the correction information obtained from the slope and the intercept in the actual characteristics. The variation in current consumption of the at least one amplification circuit of the amplifier can be reduced by this procedure.

The multiplier may be disposed on an output side of the digital control circuit, and the adder may be disposed on an output side of the multiplier.

In this arrangement, the bias current setting can be corrected in a simple order.

A second adder that differs from the adder may be disposed between the digital control circuit and the multiplier.

In this arrangement, the bias current can be adjusted more precisely, and the variation in current consumption of the at least one amplification circuit of the amplifier can further be reduced.

The amplification circuit may include a plurality of amplification circuits, and the correction information may include a plurality of pieces of correction information. The second memory may include a plurality of information repositories each storing one of the plurality of pieces of correction information, each of the plurality of pieces of correction information being associated with one of the plurality of amplification circuits. The amplifier may further include a multiplexer that selects one of the plurality of information repositories and that connects the one of the plurality of information repositories to the correction circuit.

In this arrangement, the bias current setting can be corrected for each of the plurality of amplification circuits. Thus, the variation in current consumption of the amplification circuits of the amplifier can be reduced even if the amplifier includes the plurality of amplification circuits.

One of the plurality of amplification circuits may be selected in accordance with a frequency band of a radio-frequency signal that is input into the amplifier, the multiplexer may be configured to select from the plurality of information repositories an information repository that stores one of the plurality of pieces of correction information that is associated with the one of the plurality of amplification circuits that is selected, and the correction circuit may be configured to correct the bias current setting in accordance with the one of the plurality of pieces of correction information that is stored in the information repository that is selected.

An amplification circuit and a piece of correction information that are appropriate to a frequency band can be selected and used by this procedure, and thus the variation in current consumption can be reduced if the plurality of amplification circuits are provided.

An amplifier manufacturing method according to an aspect of the present disclosure is a method of manufacturing an amplifier including an amplification circuit through which a bias current flows, a first memory that is configured to store control information to specify the bias current to be fed through the amplification circuit, a digital control circuit that generates a bias current setting to set the bias current in accordance with the control information, and a bias circuit that determines the bias current in the amplification circuit in accordance with the bias current setting. The amplifier manufacturing method includes a step of providing the amplifier further including a second memory and a correction circuit, the second memory storing no correction information to correct the bias current setting, the correction circuit correcting the bias current setting, a step of measuring an actual bias current that flows through the amplification circuit in response to an input of the bias current setting into the bias circuit, the bias current setting being based on the control information and uncorrected, a step of deriving the correction information in accordance with the bias current setting, which is based on the control information and uncorrected, and the actual bias current, which is obtained by measurement, and a step of storing in the second memory the correction information, which has been derived.

In this way, the correction information obtained by measuring the actual bias current is stored in the second memory, and thus the bias current setting can be corrected by using the stored correction information. The variation in current consumption of the amplification circuit of the amplifier can be reduced by this procedure.

A bias current correction method according to an aspect of the present disclosure relates to an amplifier including an amplification circuit through which a bias current flows, a first memory that is configured to store control information to specify the bias current to be fed through the amplification circuit, a digital control circuit that is configured to generate a bias current setting to set the bias current in accordance with the control information, and a bias circuit that is configured to determine the bias current in the amplification circuit in accordance with the bias current setting. The bias current correction method is a method of correcting the bias current in the amplification circuit, and the method includes a step of providing the amplifier further including a second memory and a correction circuit, the second memory storing correction information obtained by measuring an actual bias current that flows through the amplification circuit in response to an input of the bias current setting into the bias circuit, the bias current setting being based on the control information, the correction circuit correcting the bias current setting, a step of reading the control information from the first memory, a step of generating the bias current setting, which is a digital signal, in the digital control circuit in accordance with the control information, a step of reading the correction information from the second memory in accordance with the control information, a step of correcting the bias current setting by using the correction circuit in accordance with the correction information and generating the bias current setting, which has been corrected and is a digital signal, and a step of determining the bias current in the amplification circuit by using the bias circuit in accordance with the bias current setting, which has been corrected, and feeding the bias current through the amplification circuit.

In this way, the bias current setting is corrected in accordance with the correction information obtained by measuring the actual bias current in the amplification circuit, and thus the variation in the bias current in the amplification circuit can be reduced. The variation in current consumption of the amplification circuit of the amplifier can be reduced by this procedure.

The variation in current consumption of at least one amplification circuit of an amplifier can be reduced.

BRIEF DESCRIPTION OF THE SEVERAL VIEWS OF THE DRAWINGS

FIGS. 2B and 2C are illustrations each depicting a relationship between a bias current setting and a secondary current in the current mirror circuit of the amplifier.

DETAILED DESCRIPTION (Details Leading to Present Disclosure)

Figure 1:
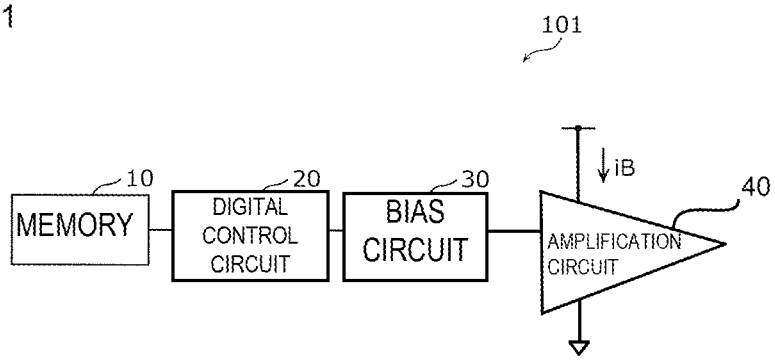
FIG. 1 is a block diagram of an amplifier according to a comparative example.

First, as an example, referring to an amplifier 101 according to a comparative example, details leading to the present disclosure will be described. FIG. 1 is a block diagram of the amplifier 101 according to the comparative example.

As depicted in FIG. 1, the amplifier 101 in the comparative example includes a memory 10, a digital control circuit 20, a bias circuit 30, and an amplification circuit 40.

The memory 10 stores control information to specify a bias current iB to be fed through the amplification circuit 40. The digital control circuit 20 generates a bias current setting (digital signal) to set the bias current iB in accordance with the control information stored in the memory 10.

The bias circuit 30 determines the bias current iB in the amplification circuit 40 in accordance with the bias current setting that is output from the digital control circuit 20. The bias circuit 30 converts into an analog signal the bias current setting that is digitally input and outputs a bias voltage to the amplification circuit 40.

The bias voltage that is applied feeds the bias current iB through the amplification circuit 40. The bias current iB corresponds to the current consumption of the amplification circuit 40. To reduce the variation in the current consumption of the amplification circuit 40 of the amplifier 101, it is necessary to reduce the variation in the bias current iB in the amplification circuit 40.

Figure 2A:
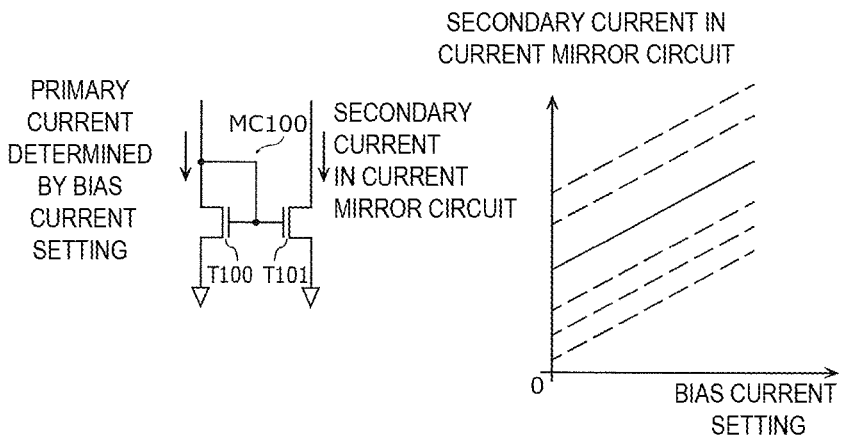
FIG. 2A is an illustration depicting an example of a current mirror circuit included in a bias circuit of the amplifier.
Figure 2C:
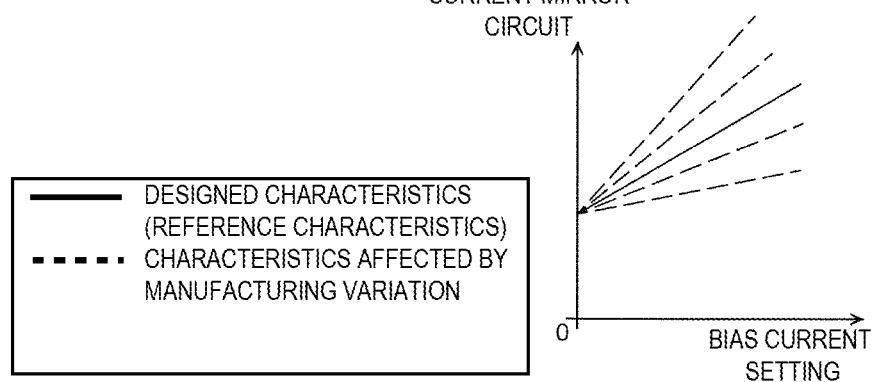

Referring to FIGS. 2A-2C, a description will be given of an example of difficulty that can be encountered in using the amplifier 101 according to the comparative example. FIG. 2A is an illustration depicting an example of a current mirror circuit included in the bias circuit 30 of the amplifier 101. FIGS. 2B and 2C are illustrations each depicting a relationship between a bias current setting and a secondary current in the current mirror circuit of the amplifier 101.

The bias circuit 30 includes a number of current mirror circuits, an example of which is depicted in FIG. 2A as a current mirror circuit MC100. The current mirror circuit MC100 includes a transistor T100 and a transistor T101. The current mirror circuit MC100 has a fixed ratio between a primary current, which is a value of current flowing into the transistor T100, and a secondary current, which is a value of current flowing into the transistor T101. A designer determines the ratio at a design stage. However, each of the transistors T100 and T101, which are semiconductor elements, is subjected to manufacturing variation. Thus, the value of the secondary current, which may be regarded as an output current of the current mirror circuit MC100, sometimes deviates from a value originally designed.

For example, if the transistors T100 and T101 are subjected to manufacturing variation while the size ratio (the ratio of the size of a transistor to the size of the other transistor) is maintained, the characteristics (relational expression) of the secondary current in the current mirror circuit against a bias current setting vary so that the intercept increases or decreases relative to the designed characteristics as represented by broken lines in FIG. 2B. Further, for example, if the transistors T100 and T101 are subjected to manufacturing variation and the size ratio is not maintained, the characteristics of the secondary current in the current mirror circuit against the bias current setting vary so that the slope increases or decreases relative to the designed characteristics as represented by broken lines in FIG. 2C.

In this way, the value of the secondary current in the current mirror circuit varies because of the variation in the intercept as depicted in FIG. 2B and the variation in the slope as depicted in FIG. 2C. The amplifier 101 is formed by a number of current mirror circuits and other elements. Since each element is subjected to manufacturing variation, the variation in the current consumption of the amplifier 101 is affected by the superposition of all the causes of variation described above.

An amplifier according to the present embodiment includes a correction circuit that corrects a bias current setting to be input to the bias circuit 30 in accordance with correction information obtained by measuring an actual bias current iB flowing through the amplification circuit 40. The variation in the bias current iB in the amplification circuit 40, the variation being generated by a cause, such as manufacturing variation of the amplifier, can be reduced by including this correction circuit, leading to reduction in the variation in the current consumption.

Hereinafter, the embodiment of the present disclosure will be described in detail with reference to the drawings. The embodiment described below presents a comprehensive or specific example. Numeric values, elements, arrangements of elements, and modes of connecting elements, which are described in the embodiment below, are examples and are not intended to limit the present disclosure. Of elements in the embodiment below, elements that are not presented in independent claims are described as optional.

Embodiment

[1. Configuration of Amplifier]

Referring to FIGS. 3A to 5, a description will be given of a configuration of an amplifier 1 according to the embodiment. Some elements are the same in the embodiment and in the comparative example 1, but the elements including the same elements will be described anew in the embodiment.

Figure 3A:
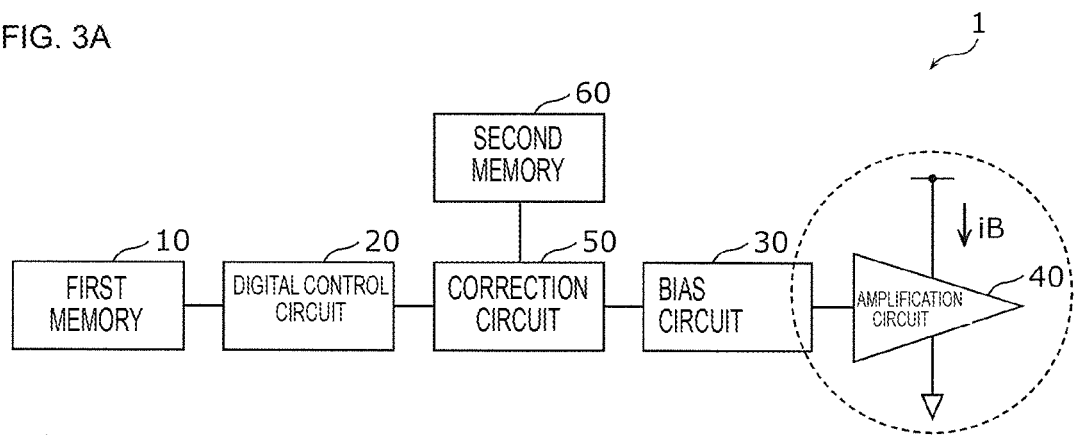
FIGS. 3A and 3B illustrate a block diagram of an amplifier according to an embodiment and a circuit diagram depicting a portion of a bias circuit and an example of an amplification circuit.
Figure 3B:
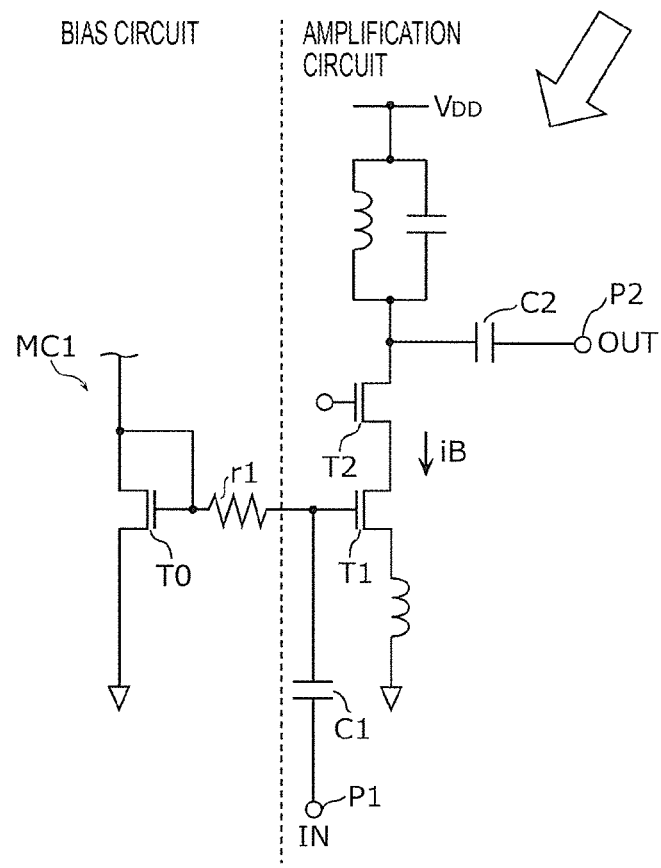
Figure 4:
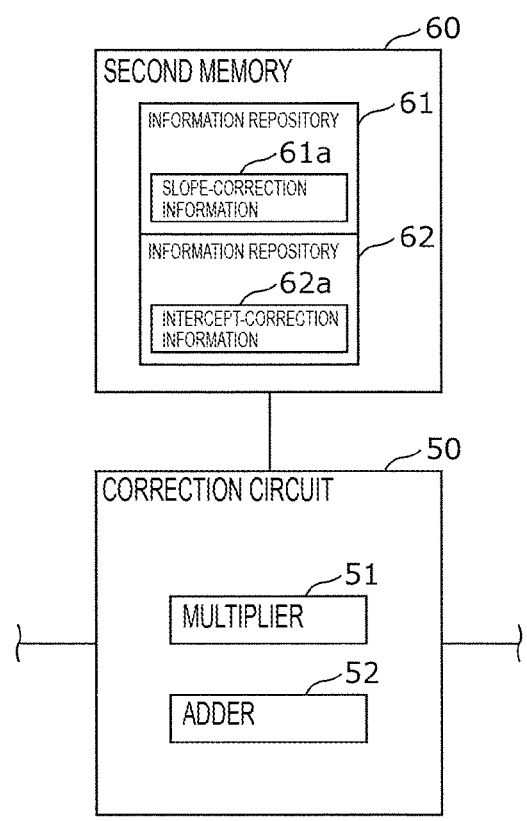
FIG. 4 is a diagram depicting a correction circuit and a second memory of the amplifier according to the embodiment.
Figure 5:
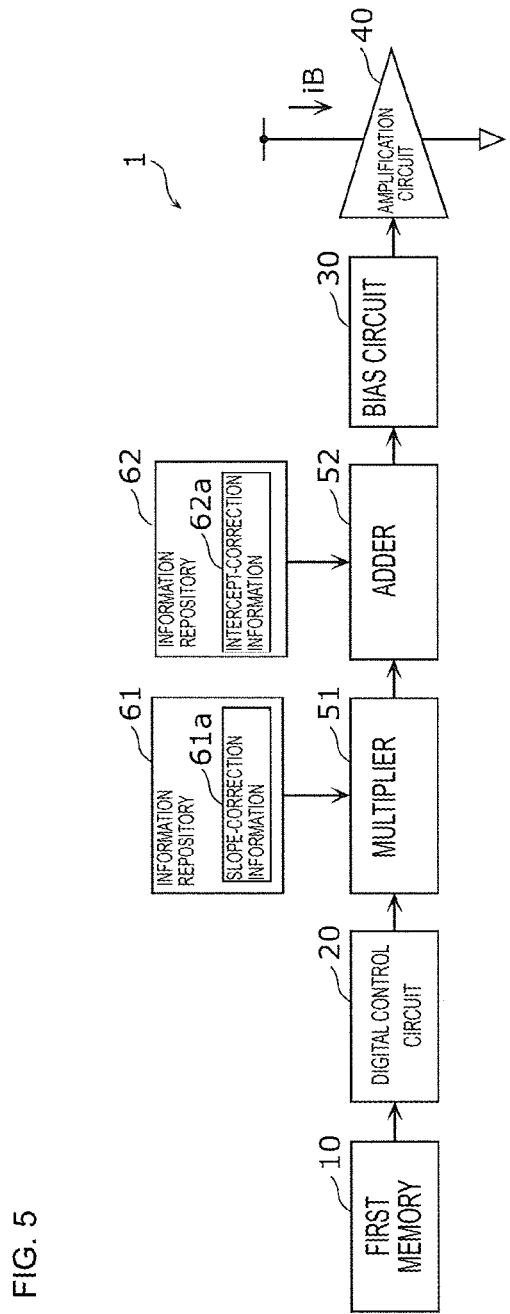
FIG. 5 is a control block diagram of the amplifier according to the embodiment.

FIG. 3A illustrates a block diagram of the amplifier 1 according to the embodiment and FIG. 3B illustrates a circuit diagram depicting a portion of a bias circuit 30 and an example of an amplification circuit 40. FIG. 4 is a diagram depicting a correction circuit 50 and a second memory 60 of the amplifier 1. FIG. 5 is a control block diagram of the amplifier 1.

The amplifier 1 is installed, for example, in a communication apparatus that amplifies a radio-frequency signal. Examples of a radio-frequency signal that is input into the amplifier 1 include a radio-frequency signal in the 2.4 GHz band or the 5 GHz band in the IEEE 802.11 standard.

As depicted in FIG. 3A, the amplifier 1 includes a first memory 10, a digital control circuit 20 connected to the first memory 10, the second memory 60, the correction circuit 50 connected individually to the digital control circuit 20 and to the second memory 60, the bias circuit 30 connected to the correction circuit 50, and the amplification circuit 40 connected to the bias circuit 30.

The first memory 10 is a volatile memory that stores control information to specify a bias current iB to be fed through the amplification circuit 40. The control information, which is transmitted from a control circuit of the communication apparatus, is written into the first memory 10 appropriately.

The digital control circuit 20 is a decoder that generates a bias current setting to set a bias current. As depicted in FIG. 5, the digital control circuit 20 reads the control information from the first memory 10, generates the bias current setting, which is a digital control signal, and outputs the bias current setting to the correction circuit 50.

The second memory 60 is a nonvolatile memory that stores correction information to correct the bias current setting. As depicted in FIG. 4, the second memory 60 includes information repositories 61 and 62, which store digitized correction information. The information repository 61 stores slope-correction information 61a, and the information repository 62 stores intercept-correction information 62a. The correction information (the slope-correction information 61a and the intercept-correction information 62a) is derived, for example, by measuring an actual bias current that flows through the amplification circuit 40 in response to an input of the bias current setting into the bias circuit 30, the bias current setting being based on the control information. A specific method of deriving the correction information will be described below.

The correction circuit 50 is a computing circuit that corrects the bias current setting in accordance with the correction information stored in the second memory 60. The correction circuit 50 corrects the bias current setting, which is generated by the digital control circuit 20, in accordance with the correction information that is read from the second memory 60 and outputs the bias current setting, which has been corrected, to the bias circuit 30.

As depicted in FIG. 4, the correction circuit 50 includes a multiplier 51 and an adder 52. As depicted in FIG. 5, the multiplier 51 is disposed on the output side of the digital control circuit 20 and corrects the bias current setting by using the slope-correction information 61a. The adder 52 is an example of a first adder disposed on the output side of the multiplier 51 and corrects the bias current setting by using the intercept-correction information 62a.

The bias circuit 30 determines the bias current iB in the amplification circuit 40 in accordance with the bias current setting that is output from the digital control circuit 20 and that is input into the bias circuit 30. The bias circuit 30 is, for example, a digital-to-analog converter (DAC), converts into an analog value the bias current setting that is input as a digital value, and outputs a bias voltage to the amplification circuit 40. The bias circuit 30 includes a plurality of current mirror circuits as described above.

A current mirror circuit MC1 is formed at a portion connecting the bias circuit 30 and the amplification circuit 40. Specifically, as depicted in FIG. 3B, the drain and the gate of a transistor T0 disposed in the bias circuit 30 are connected, and the gate of the transistor T0 is connected via a resistor r1 to the gate of a transistor T1 disposed in the amplification circuit 40. The current mirror circuit MC1 causes the gate potential of the transistor T0 to be equal to the gate potential of the transistor T1. A voltage between the gate and the source of the transistor T1 determines the bias current iB that flows through the amplification circuit 40. A voltage applied to the gate of the transistor T1 becomes a bias voltage applied to the amplification circuit 40. The bias current iB corresponds to the current consumption of the amplification circuit 40.

A radio-frequency signal that is input to a radio-frequency (RF) input terminal P1 is amplified by the amplification circuit 40, to which the bias voltage is applied, and is output to an RF output terminal P2. The amplification circuit 40 has the transistor T1 and a transistor T2 in a cascode connection. A capacitor C1 for blocking direct current (DC) is disposed between the gate of the transistor T1 and the RF input terminal P1. A terminal having a predetermined voltage is connected to the gate of the transistor T2, and a capacitor C2 for blocking DC is connected between the drain of the transistor T2 and the RF output terminal P2.

The amplifier 1 according to the present embodiment includes the amplification circuit 40, the first memory 10, the digital control circuit 20, the second memory 60, the correction circuit 50, and the bias circuit 30. The bias current iB flows through the amplification circuit 40. The first memory 10 stores the control information to specify the bias current iB to be fed through the amplification circuit 40. The digital control circuit 20 generates the bias current setting to set the bias current iB in accordance with the control information. The second memory 60 stores the correction information to correct the bias current setting. The correction circuit 50 corrects the bias current setting in accordance with the correction information. The bias circuit 30 determines the bias current iB in the amplification circuit 40 in accordance with the bias current setting, which has been corrected. The bias current setting, which is based on the control information, is input into the bias circuit 30, and the actual bias current iB that flows through the amplification circuit 40 in response to the input is measured. The correction circuit 50 corrects the bias current setting in accordance with the correction information obtained by this measurement.

In this way, the bias current setting is corrected in accordance with the correction information obtained by measuring the actual bias current iB in the amplification circuit 40, and thus the variation in the bias current iB (that is, current consumption) in the amplification circuit 40 of the amplifier 1 can be reduced.

Further, in the amplifier 1, the bias current is not corrected by using an analog circuit, such as the bias circuit 30. The bias current setting, which is a digital signal to be input into the bias circuit 30, is corrected by using digital computation, and thereafter the bias current is determined in accordance with the bias current setting, which has been corrected. Thus, such an error in current as is generated in an analog circuit is unlikely to occur, and the variation in the bias current iB (that is, current consumption) in the amplification circuit 40 can be reduced.

[2. Method of Manufacturing Amplifier]

Figure 6:
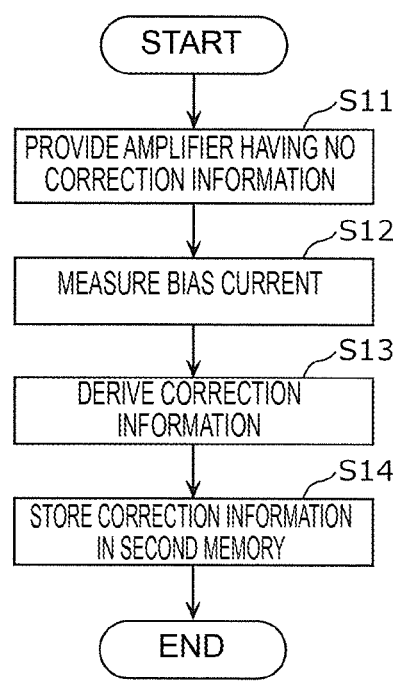
FIG. 6 is a flowchart depicting a method of manufacturing the amplifier according to the embodiment.
Figure 7A:
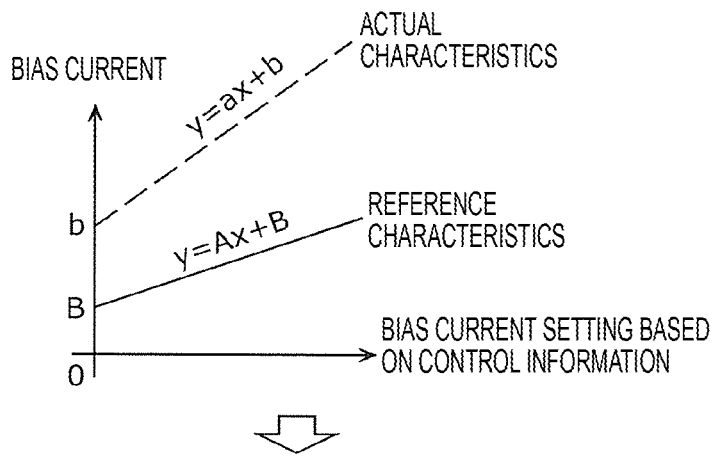
FIGS. 7A, 7B, and 7C are schematic illustrations depicting a procedure that derives correction information in a process of deriving correction information in FIG. 6.
Figure 7B:
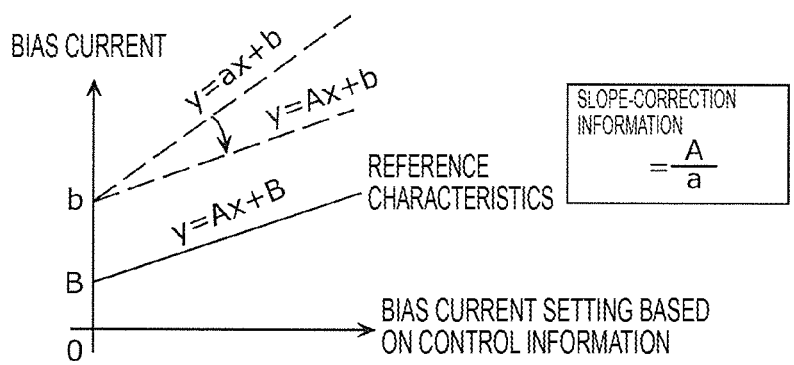
Figure 7C:
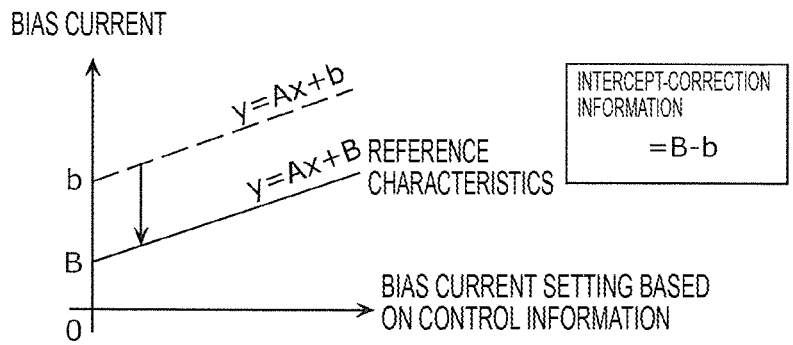

Referring to FIGS. 6 and 7, a description will be given of a method of manufacturing the amplifier 1. FIG. 6 is a flowchart depicting the method of manufacturing the amplifier 1. FIGS. 7A-7C are schematic illustrations depicting a procedure that derives the correction information in a process of deriving the correction information in FIG. 6.

First, an amplifier having no stored correction information yet in the second memory 60 is provided (S11). In the amplifier, the second memory 60 having no stored correction information yet, the first memory 10, the digital control circuit 20, the correction circuit 50, the bias circuit 30, and the amplification circuit 40 are formed, for example, on each chip of a semiconductor wafer that is not diced yet.

Next, the bias current setting, which is based on the control information, is input into the bias circuit 30, and the actual bias current iB that flows through the amplification circuit 40 in response to the input is measured (S12). The actual bias current iB is measured, for example, by inserting an ammeter between the amplifier 1 and a power supply. On this occasion, the bias current iB is measured at two measurement points or more to obtain actual characteristics of the bias current iB by using linear approximation.

Next, the correction information described above is derived from the bias current setting, which is based on the control information and uncorrected, and the measured bias current iB (S13). Actual characteristics, which represent the bias current iB against the bias current setting, are obtained from bias current settings based on the control information and measured values of the bias current iB by using, for example, the method of least squares.

FIG. 7A presents, as an example, actual characteristics expressed by a relationship $y=ax+b$ and reference characteristics expressed by a relationship $y=Ax+B$. The relationship $y=ax+b$ is a function of the bias current setting which expresses the slope of the bias current.

As depicted in FIG. 7B, the slope-correction information 61a is derived from a comparison between the slope in the actual characteristics expressed as $y=ax+b$ and the slope in the reference characteristics expressed as $y=Ax+B$. The slope-correction information 61a is a value to bring the slope in the actual characteristics close to the slope in the reference characteristics and is equal to, for example, A/a.

As depicted in FIG. 7C, the intercept-correction information 62a is derived from a comparison between the y-intercept in the characteristics expressed as y=Ax+b and the y-intercept in the reference characteristics expressed as y=Ax+B. The intercept-correction information 62a is a value to bring the intercept in the characteristics expressed as y=Ax+b close to the intercept in the reference characteristics and is equal to, for example, B−b.

Next, the slope-correction information 61a and the intercept-correction information 62a, which have been derived, are individually stored in the second memory 60 (S14). Subsequently, the semiconductor wafer is diced, chips are encapsulated in an insulating resin, and other processing is performed. The amplifier 1 is manufactured in this way.

Thus, the correction information obtained by measuring the actual bias current iB is stored in the second memory 60, and thus the bias current setting can be corrected by using the stored correction information. The variation in the bias current iB (that is, current consumption) in the amplification circuit 40 of the amplifier 1 can be reduced by this correction. In addition, since the variation in current consumption can be reduced, the manufacturing yield of the amplifier 1 can be improved.

[3. Method of Correcting Bias Current]

Figure 8:
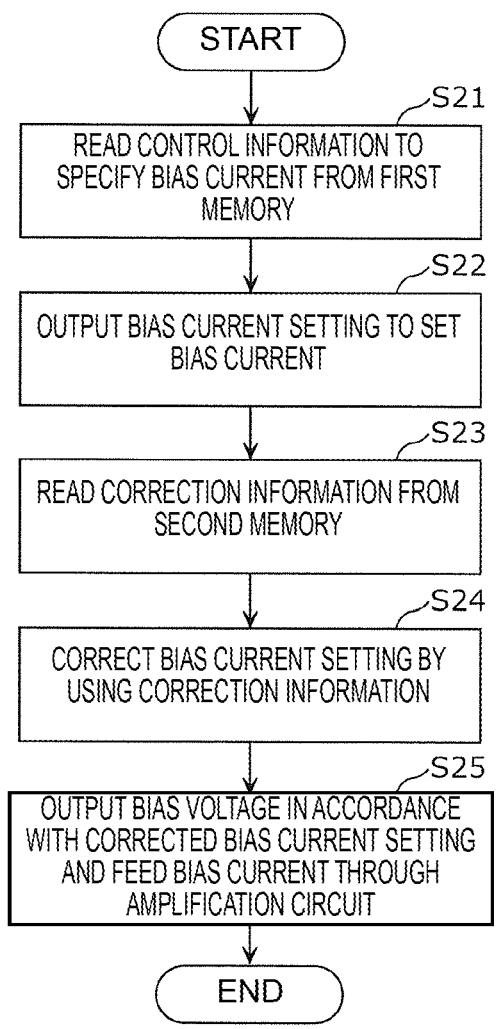
FIG. 8 is a flowchart depicting a method of correcting a bias current in the amplifier according to the embodiment.

Referring to FIG. 8, a description will be given of a method of correcting the bias current iB to be fed through the amplification circuit 40. FIG. 8 is a flowchart depicting a method of correcting a bias current in the amplifier 1.

First, there is provided the amplifier 1, which includes the second memory 60 and the correction circuit 50 described above in addition to the first memory 10, the digital control circuit 20, the bias circuit 30, and the amplification circuit 40. The control information to specify the bias current iB is read from the first memory 10 (S21). The control information is read from the first memory 10 and input into the digital control circuit 20 as a digital signal.

Next, the digital control circuit 20 generates the bias current setting to set the bias current iB in accordance with the control information, which has been read (S22). The bias current setting is output from the digital control circuit 20 to the correction circuit 50 as a digital signal.

The correction information to correct the bias current setting is read from the second memory 60 (S23). The correction information is the information obtained by subjecting the amplifier to an actual measurement in advance. Specifically, the correction information is obtained by measuring the actual bias current iB that flows through the amplification circuit 40 in response to an input of the bias current setting into the bias circuit 30, the bias current setting being based on the control information and uncorrected. The obtained correction information is stored in the information repositories 61 and 62. In step S23, the correction information, which is stored, is read from the second memory 60 and input into the correction circuit 50 as a digital signal. The processing of step S23 may be performed between step S21 and step S22 or may be performed at the same time as step S22.

Next, the correction circuit 50 corrects the bias current setting in accordance with the correction information, which has been read (S24). Thus, the bias current setting, which is a digital signal and has been corrected, is generated. A sequence of correcting the bias current setting begins with a correction by using the multiplier 51 followed by a correction by using the adder 52. After these corrections are finished, the correction circuit 50 outputs the bias current setting, which has been corrected, to the bias circuit 30.

Next, the bias circuit 30 determines the bias current iB in the amplification circuit 40 in accordance with the bias current setting, which has been corrected (S25). Specifically, the bias current setting that is input as a digital value is converted into an analog value, and a bias voltage is output to the amplification circuit 40. Thus, the bias current iB, which has been corrected, flows through the amplification circuit 40. The bias current iB in the amplifier 1 is corrected in steps S21 to S25.

In this way, the variation in the bias current iB (that is, current consumption) in the amplification circuit 40 can be reduced by correcting the bias current setting in accordance with the correction information that is read from the second memory 60.

Further, in the amplifier 1, the bias current is not corrected by using an analog circuit, such as the bias circuit 30. The bias current setting, which is a digital signal to be input into the bias circuit 30, is corrected by using digital computation, and thereafter the bias current is determined in accordance with the bias current setting, which has been corrected. Thus, such an error in current as is generated in an analog circuit is unlikely to occur, and the variation in the bias current iB (that is, current consumption) in the amplification circuit 40 can be reduced.

(First Modification)

Figure 9:
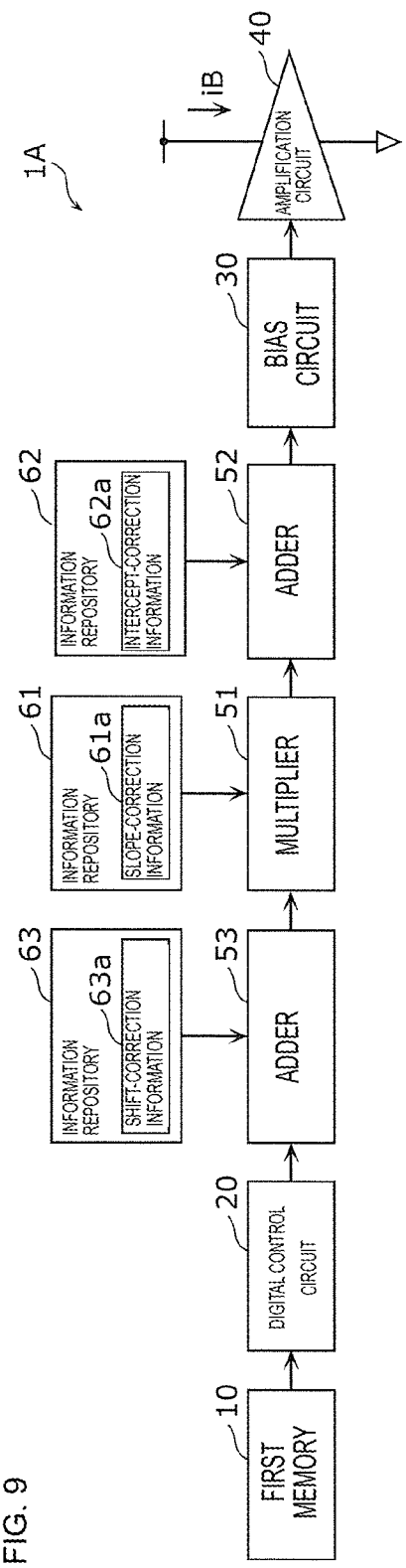
FIG. 9 is a control block diagram of an amplifier according to a first modification of the embodiment.

FIG. 9 is a control block diagram of an amplifier 1A according to a first modification of the embodiment.

The first modification differs from the embodiment described above in that an information repository 63 storing a shift-correction information 63a is added to the second memory 60 and an adder 53 is added to the correction circuit 50 in the amplifier 1A according to the first modification.

The shift-correction information 63a in the first modification is used, for example, in a case where control information sent from the control circuit of the communication apparatus is desirably adjusted in advance or in similar cases. The adder 53 is an example of a second adder disposed between the digital control circuit 20 and the multiplier 51. The bias current setting that is output from the digital control circuit 20 is corrected by the adder 53 by using the shift-correction information 63a and thereafter corrected by the multiplier 51 and by the adder 52 in this order.

The bias current iB can be adjusted more precisely by using the amplifier 1A according to the first modification.

(Second Modification)

Figure 10:
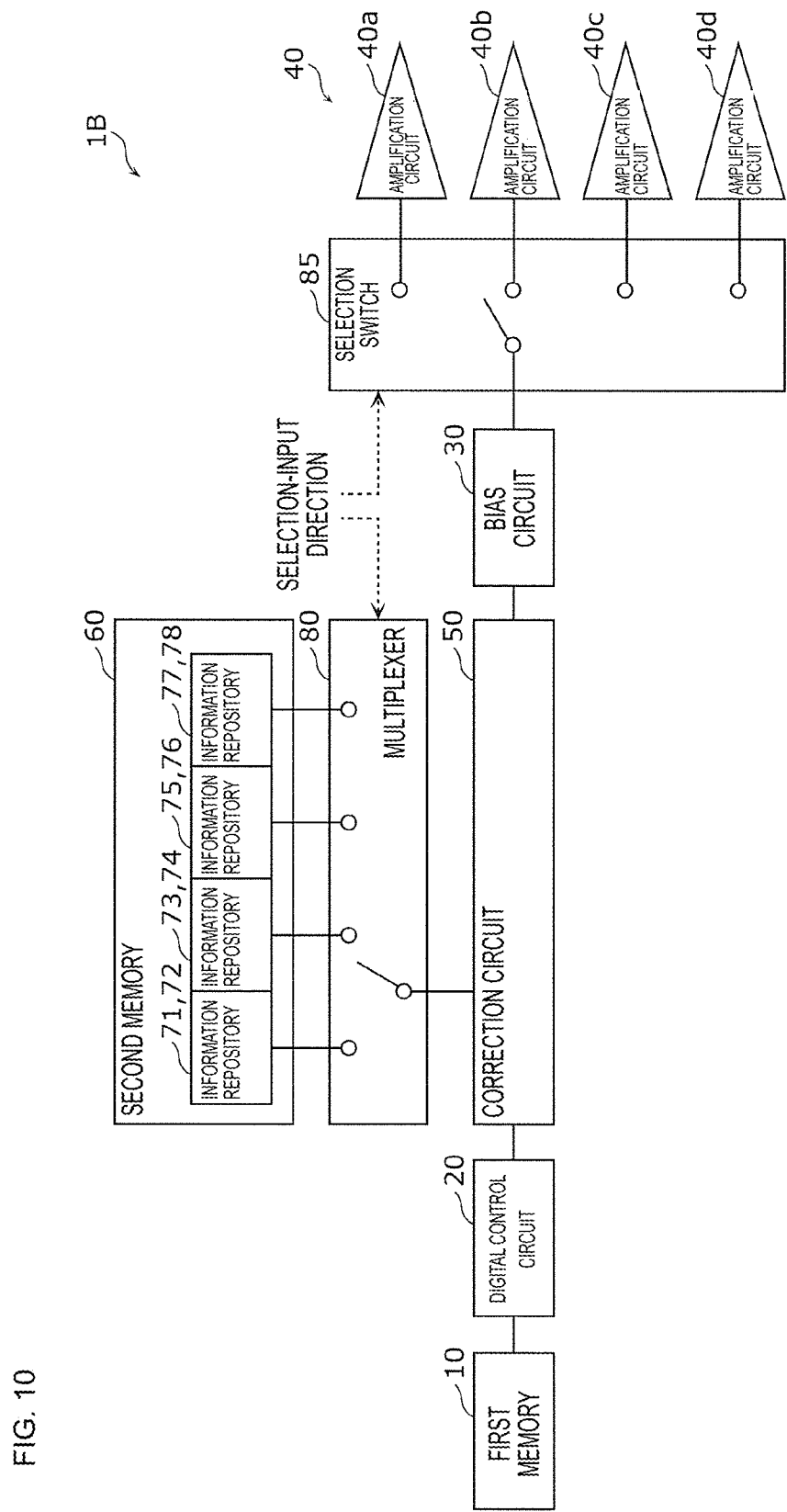
FIG. 10 is a block diagram of an amplifier according to a second modification of the embodiment.
Figure 11:
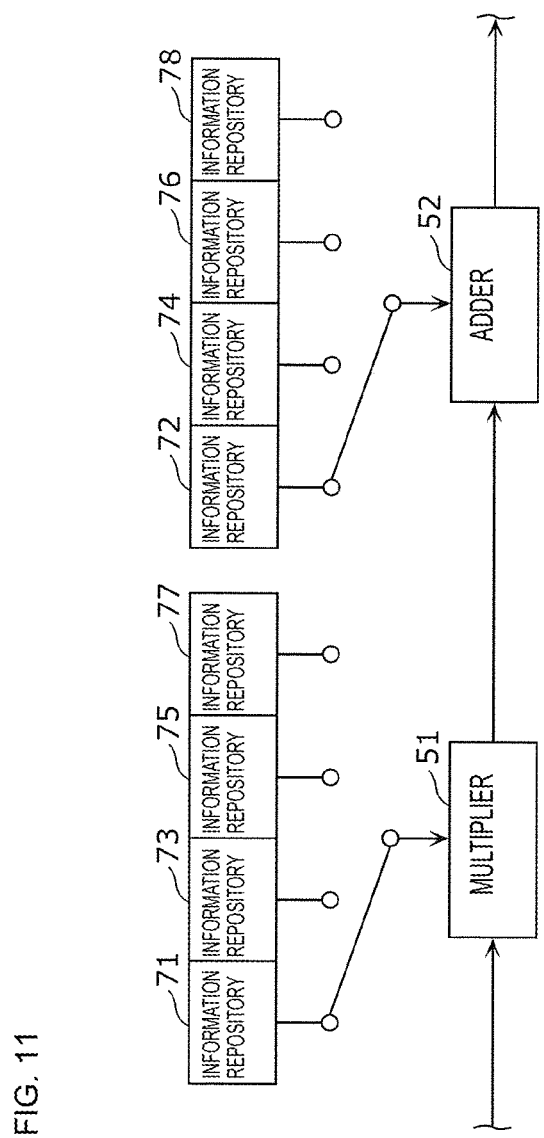
FIG. 11 is a diagram depicting a portion of a control block diagram of the amplifier according to the second modification of the embodiment.

FIG. 10 is a block diagram of an amplifier 1B according to a second modification of the embodiment. FIG. 11 is a diagram depicting a portion of a control block diagram of the amplifier 1B according to the second modification. The second modification differs from the embodiment described above in that the amplifier 1B according to the second modification includes a plurality of amplification circuits 40a, 40b, 40c, and 40d.

As depicted in FIG. 10, a selection switch 85 is disposed between the bias circuit 30 and the amplification circuits 40a to 40d. The bias circuit 30 is connected to the common terminal of the selection switch 85, and the amplification circuits 40a to 40d are each connected to a selection terminal of the selection switch 85.

A multiplexer 80 is disposed between the correction circuit 50 and the second memory 60. The correction circuit 50 is connected to the common terminal of the multiplexer 80. The second memory 60 includes information repositories 71, 72, 73, 74, 75, 76, 77, and 78 storing pieces of correction information each of which is derived in association with one of the amplification circuits 40a to 40d. The information repositories 71 to 78 are each connected to a selection terminal of the multiplexer 80.

In the amplifier 1B according to the second modification, one of the plurality of amplification circuits 40a to 40d is selected in accordance with the frequency band of a radio-frequency signal that is input into the amplification circuits 40a to 40d. In association with the amplification circuit that is selected, a pair of information repositories (for example, the information repositories 71 and 72) of the plurality of information repositories 71 to 78 is connected to the correction circuit 50, and the bias circuit 30 and the amplification circuit are connected. In this case, the pair of information repositories functions as a single information repository. The switching of these connections and selections is controlled by a selection-input direction from the control circuit included in the communication apparatus.

Even if the amplifier 1B includes the plurality of amplification circuits 40a to 40d as in the second modification, the variation in the bias current iB caused by manufacturing variation can be reduced by correcting the bias current setting in accordance with the pieces of correction information stored in the information repositories 71 to 78.

Other Embodiments

The amplifiers 1, 1A, and 1B according to the embodiment of the present disclosure have been described, but the scope of the present disclosure is not limited to the embodiment described above. The following modifications of the embodiment described above may also be within the scope of the present disclosure.

For example, the amplifier 1 may be configured to amplify a radio-frequency signal that differs from the IEEE 802.11 standard (such as the Long Term Evolution (LTE) standard or the Wideband Code Division Multiple Access (W-CDMA) standard).

Each transistor is not limited to an n-type field effect transistor, which is used in the present embodiment, and may be a p-type field effect transistor or a bipolar transistor.

If designed reference characteristics are expressed by a curve of degree n, where n is an integer equal to 2 or greater, actual characteristics from which correction information is derived may be approximated by using a curve of degree n.

INDUSTRIAL APPLICABILITY

The present disclosure is widely applicable for communication apparatuses as an amplifier having at least one amplification circuit with a reduced variation in current consumption.

REFERENCE SIGNS LIST

1, 1A, 1B amplifier
10 first memory
20 digital control circuit
30 bias circuit
40, 40a, 40b, 40c, 40d amplification circuit
50 correction circuit
51 multiplier
52, 53 adder
60 second memory
61, 62, 63 information repository
61a slope-correction information
62a intercept-correction information
63a shift-correction information
71, 72, 73, 74, 75, 76, 77, 78 information repository
80 multiplexer
85 selection switch
C1, C2 capacitor
iB bias current
MC1 current mirror circuit
T0, T1, T2 transistor
P1 RF input terminal
P2 RF output terminal
r1 resistor

The invention claimed is:

1. An amplifier comprising:
an amplification circuit, wherein a bias current flows through the amplification circuit;
a first memory configured to store control information specifying the bias current;
a digital control circuit configured to generate a bias current setting for setting the bias current based on the control information;
a second memory configured to store correction information specifying a correction to the bias current setting;
a correction circuit configured to correct the bias current setting based on the correction information; and
a bias circuit configured to determine the bias current in the amplification circuit based on the corrected bias current setting,
wherein the correction information is obtained by measuring an actual bias current that flows through the amplification circuit in response to an input of the bias current setting into the bias circuit, and
wherein the correction circuit comprises a multiplier and an adder, the multiplier and adder being configured to correct the bias current setting based on the correction information.

2. The amplifier according to claim 1, wherein the bias circuit is configured to output a voltage to the amplification circuit to determine the bias current in the amplification circuit.

3. A method of correcting a bias current of an amplifier that comprises an amplification circuit through which the bias current flows, a first memory configured to store control information specifying the bias current, a digital control circuit configured to generate a bias current setting for setting the bias current based on the control information, a bias circuit configured to determine the bias current in the amplification circuit based on the bias current setting, a second memory configured to store correction information obtained by measuring an actual bias current that flows through the amplification circuit in response to an input of the bias current setting into the bias circuit, and a correction circuit configured to correct the bias current setting based on the correction information and that comprises a multiplier and an adder, the multiplier and adder being configured to correct the bias current setting based on the correction information, the method comprising:
reading the control information from the first memory;
generating the bias current setting as a digital signal, in the digital control circuit, based on the control information;
reading the correction information from the second memory in accordance with the control information;
correcting the bias current setting based on the correction information by using the multiplier and the adder of the correction circuit, and generating the corrected bias current setting; and determining the bias current in the amplification circuit by using the bias circuit in accordance with the corrected bias current setting, and feeding the bias current through the amplification circuit.

4. The amplifier according to claim 1, wherein:
the multiplier is configured to correct the bias current setting based on correction information specifying a slope of the bias current, the bias current being expressed as a function of the bias current setting, and
the adder is configured to correct the bias current setting based on a y-intercept of the bias current function.

5. The amplifier according to claim 1, wherein the multiplier is at an output side of the digital control circuit and the adder is at an output side of the multiplier.

6. The amplifier according to claim 5, further comprising a second adder that is different from the adder, and that is between the digital control circuit and the multiplier.

7. The amplifier according to claim 1, comprising a plurality of the amplification circuits, wherein:
the correction information comprises a plurality of pieces of correction information,
the second memory comprises a plurality of information repositories that each store one of the plurality of pieces of correction information, each of the plurality of pieces of correction information being associated with one of the plurality of amplification circuits, and
the amplifier further comprises a multiplexer configured to select one of the plurality of information repositories and to connect the selected information repository to the correction circuit.

8. The amplifier according to claim 7, wherein:
one of the plurality of amplification circuits is selected based on a frequency band of a radio-frequency signal that is input into the amplifier,
the multiplexer is configured to select, from the plurality of information repositories, an information repository that stores one of the plurality of pieces of correction information that is associated with the selected amplification circuit, and
the correction circuit is configured to correct the bias current setting based on the one of the plurality of pieces of correction information that is stored in the selected information repository.

9. A method of manufacturing an amplifier that comprises an amplification circuit through which a bias current flows, a first memory configured to store control information specifying the bias current, a second memory initially storing no correction information, a digital control circuit configured to generate a bias current setting for setting the bias current based on the control information, a correction circuit configured to correct the bias current setting based on the correction information and that comprises a multiplier and an adder, the multiplier and adder being configured to correct the bias current setting based on the correction information, and a bias circuit configured to determine the bias current based on the bias current setting, the method comprising:
measuring an actual bias current that flows through the amplification circuit in response to an input of the bias current setting into the bias circuit, the bias current setting being uncorrected and based on the control information;
deriving the correction information based on the uncorrected bias current setting and the measured actual bias current; and
storing in the second memory the derived correction information.

* * * * *